(12) United States Patent
Kuang

(10) Patent No.: US 7,782,068 B2
(45) Date of Patent: Aug. 24, 2010

(54) CIRCUIT FOR CAPACITANCE MEASUREMENT AND METHOD THEREFOR

(75) Inventor: Yu Kuang, Hsinchu (TW)

(73) Assignee: Raydium Semiconductor Corporation, Hsinchu (TW)

( * ) Notice: Subject to any disclaimer, the term of this patent is extended or adjusted under 35 U.S.C. 154(b) by 235 days.

(21) Appl. No.: 12/230,825

(22) Filed: Sep. 5, 2008

(65) Prior Publication Data
US 2009/0243631 A1    Oct. 1, 2009

(30) Foreign Application Priority Data
Mar. 25, 2008    (TW) ............................... 97110489 A

(51) Int. Cl.
*G01R 27/26* (2006.01)
(52) U.S. Cl. ....................... 324/658; 324/676
(58) Field of Classification Search ................ 324/658, 324/676, 678, 679, 686
See application file for complete search history.

(56) References Cited

U.S. PATENT DOCUMENTS

| 7,288,946 B2* | 10/2007 | Hargreaves et al. ......... 324/678 |
| 7,724,001 B2* | 5/2010 | Kleven ....................... 324/679 |
| 2008/0048680 A1* | 2/2008 | Hargreaves et al. ......... 324/686 |

* cited by examiner

*Primary Examiner*—Vincent Q Nguyen
(74) *Attorney, Agent, or Firm*—Bacon & Thomas, PLLC

(57) ABSTRACT

A measurement method for capacitance includes the following steps. First, a voltage on at least one end of a to-be-measured capacitor is switched in response to a first set of clock signals such that a level of an integrated voltage is adjusted from a start voltage level to an end voltage level in a first integration period, wherein a capacitance of the to-be-measured capacitor is relevant to a difference between the end voltage level and the start voltage level. Next, the level of the integrated voltage is adjusted from the end voltage level to the start voltage level in a second integration period in response to a second set of clock signals. Then, the capacitance of the to-be-measured capacitor is obtained according to the first and second integration periods and a known characteristic parameter.

25 Claims, 11 Drawing Sheets

CIRCUIT FOR CAPACITANCE MEASUREMENT AND METHOD THEREFOR

This application claims the benefit of Taiwan application Serial No. 97110489, filed Mar. 25, 2008, the subject matter of which is incorporated herein by reference.

BACKGROUND OF THE INVENTION

1. Field of the Invention

The invention relates in general to a capacitance measurement circuit, and more particularly to a circuit for measuring a capacitance of a to-be-measured capacitor by observing charge and discharge response times when the to-be-measured capacitor is charged and discharged and a method therefor.

2. Description of the Related Art

Conventionally, user control interface devices are usually implemented with mechanical switches. The conventional mechanical switch has to be in direct contact with the user so that it can operate in response to a control command of the user. Thus, the user's operation on the conventional mechanical device would cause structural damage to it.

In addition, touch switches have been provided and employed as the technology progresses. Conventionally, the touch switch, such as a capacitive switch, performs the control of switching by sensing the capacitance of the to-be-sensed capacitor, which is changed with the touch of the user. It is an important subject of the industry to design a capacitance measurement circuit capable of effectively measuring the capacitance variation of the to-be-measured capacitor and thus enhancing the function of the capacitive switch.

SUMMARY OF THE INVENTION

The invention is directed to a measurement circuit, which can measure a capacitance of a to-be-measured capacitor more precisely than the conventional capacitance measurement circuit.

According to a first aspect of the present invention, a capacitance measurement circuit is provided. The measurement circuit includes an integrator circuit, first and second control circuits and a processor circuit. The integrator circuit has an input end and an output end. The output end has an integrated voltage. The integrator circuit sets the integrated voltage to a start voltage level in a voltage setting period in response to a control signal. The first control circuit includes a first output end and a to-be-measured capacitor. The first control circuit switches a voltage on at least one end of the to-be-measured capacitor in response to a first set of clock signals, and selectively enables one end of the to-be-measured capacitor to be electrically coupled to a first output end so as to control the integrator circuit to perform voltage integration and to adjust the integrated voltage from the start voltage level to an end voltage level in a first integration period. A capacitance of the to-be-measured capacitor is relevant to a difference between the end voltage level and the start voltage level. The second control circuit includes a second output end and a passive device, which has a known characteristic parameter. The second control circuit switches a voltage on at least one end of the passive device in response to a second set of clock signals, and selectively enables one end of the passive device to be electrically coupled to a second output end so as to control the integrator circuit to perform the voltage integration and to adjust a level of the integrated voltage from the end voltage level to the start voltage level in a second integration period. The processor circuit provides the first and second sets of clock signals to drive the first and second control circuits, and determines the capacitance of the to-be-measured capacitor according to time lengths of the first and second integration periods and the known characteristic parameter.

According to a second aspect of the present invention, a capacitance measurement circuit is provided. The measurement circuit includes an integrator circuit, first and second control circuits and a processor circuit. The integrator circuit has an input end and an output end. The output end has an integrated voltage. The integrator circuit sets the integrated voltage to a start voltage level in a voltage setting period in response to a control signal. The first control circuit includes a first output end and a passive device, which has a known characteristic parameter. The first control circuit switches a voltage on at least one end of the passive device in response to a first set of clock signals, and selectively enables one end of the passive device to be electrically coupled to a first input end so as to control the integrator circuit to perform voltage integration and to adjust a level of the integrated voltage from the start voltage level to an end voltage level in a first integration period. The second control circuit includes a second output end and a to-be-measured capacitor. The second control circuit switches a voltage on at least one end of the to-be-measured capacitor in response to a second set of clock signals, and selectively enables one end of the to-be-measured capacitor to be electrically coupled to a second input end so as to control the integrator circuit to perform the voltage integration and to adjust the integrated voltage from the end voltage level to the start voltage level in a second integration period. A capacitance of the to-be-measured capacitor is relevant to a difference between the end and start voltage levels. The processor circuit provides the first and second sets of clock signals to drive the first and second control circuits, and determines the capacitance of the to-be-measured capacitor according to time lengths of the first and second integration periods and the known characteristic parameter.

According to a third aspect of the present invention, a capacitance measurement method applied to a capacitance measurement circuit is provided. The measurement circuit includes an integrator circuit. An output end of the integrator circuit has an integrated voltage. A to-be-measured capacitor is electrically coupled to an input end of the integrator circuit. The measurement method includes the following steps. First, a voltage on at least one end of the to-be-measured capacitor is switched in response to a first set of clock signals so as to adjust a level of the integrated voltage from a start voltage level to an end voltage level in a first integration period. A capacitance of the to-be-measured capacitor is relevant to a difference between the end voltage level and the start voltage level. Next, the level of the integrated voltage is adjusted from the end voltage level to the start voltage level in a second integration period in response to a second set of clock signals. Thereafter, the capacitance of the to-be-measured capacitor is determined according to the first and second integration periods and a known characteristic parameter.

According to a fourth aspect of the present invention, a capacitance measurement method applied to a capacitance measurement circuit is provided. The measurement circuit includes an integrator circuit. An output end of the integrator circuit has an integrated voltage. A to-be-measured capacitor is electrically coupled to an input end of the integrator circuit. The measurement method includes the following steps. First, the integrated voltage is adjusted from a start voltage level to an end voltage level in a first integration period in response to a first set of clock signals. Next, a voltage on at least one end of the to-be-measured capacitor is switched in response to a second set of clock signals so as to adjust a level of the integrated voltage from the end voltage level to the start voltage level in a second integration period. A capacitance of the to-be-measured capacitor is relevant to a difference between the end voltage level and the start voltage level. Thereafter, the capacitance of the to-be-measured capacitor is determined according to the first and second integration periods and a known characteristic parameter.

The invention will become apparent from the following detailed description of the preferred but non-limiting embodiments. The following description is made with reference to the accompanying drawings.

DETAILED DESCRIPTION OF THE INVENTION

The capacitance measurement circuit according to each embodiment is to perform charge and discharge operations on a voltage of a node using a to-be-measured capacitor and a known capacitor, and to determine the capacitance of a to-be-measured capacitor according to a ratio of an operation time of the charge operation to an operation time of the discharge operation.

First Embodiment

Figure 1:
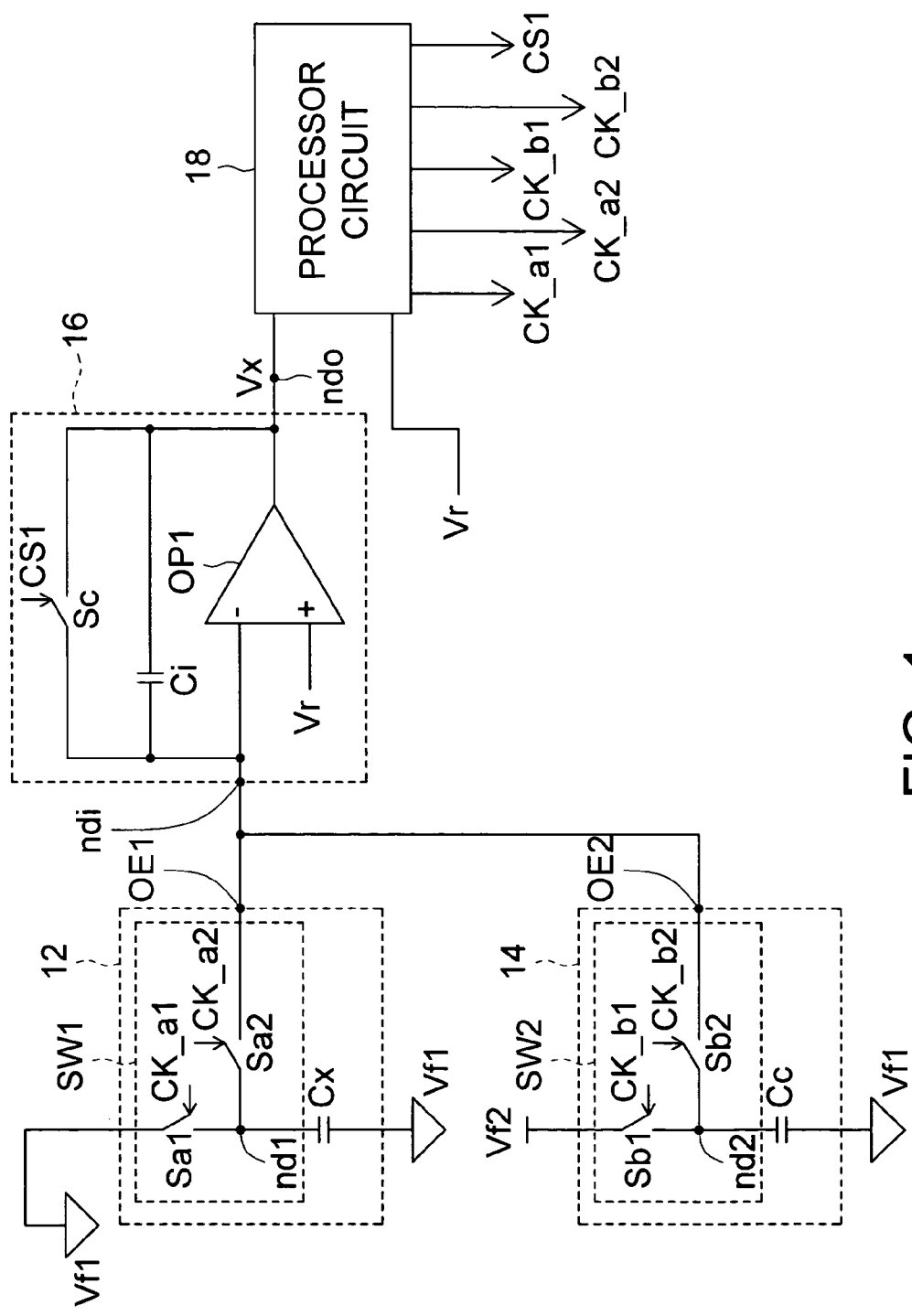
FIG. 1 is a block diagram showing a capacitance measurement circuit according to a first embodiment of the invention.

FIG. 1 is a block diagram showing a capacitance measurement circuit 10 according to a first embodiment of the invention. Referring to FIG. 1, the measurement circuit 10 includes control circuits 12 and 14, an integrator circuit 16 and a processor circuit 18. The control circuits 12 and 14 control the integrator circuit 16 to set an integrated voltage Vx on an output end ndo of the integrator circuit 16 from a start voltage level to an end voltage level and to set the integrated voltage Vx from the end voltage level to the start voltage level, respectively. In this illustrated embodiment, the level of the end voltage level is higher than that of the start voltage level. The processor circuit 18 generates a corresponding signal to drive the control circuits 12 and 14 and the integrator circuit 16 to perform the operations, and measures a capacitance of a to-be-measured capacitor Cx in response to the level variation of the integrated voltage Vx. In the following, the operation of each element of the capacitance measurement circuit 10 will be described in detail.

The integrator circuit 16 includes an input end ndi, the output end ndo, a switch Sc, an integrating capacitor Ci and an operational amplifier OP1. Two ends of the switch Sc and two ends of the integrating capacitor Ci are connected to and between the negative input end and the output end ndo of the operational amplifier OP1. The switch Sc is turned on by an enabled control signal CS1. The positive input end of the operational amplifier OP1 receives a reference voltage Vr, which may be any specific reference voltage ranging between the highest voltage VDD of the measurement circuit 10 and the grounding voltage. For example, the reference voltage Vr is substantially equal to the voltage VDD/2.

The control circuit 12 includes an output end OE1, a switch circuit SW1 and the to-be-measured capacitor Cx, and is coupled to a node nd1. The switch circuit SW1 includes switches Sa1 and Sa2, wherein first ends of the switches Sa1 and Sa2 are coupled to the node nd1, and second ends of the switches Sa1 and Sa2 are respectively for receiving a voltage Vf1 and coupled to the negative input end of the operational amplifier OP1. The switches Sa1 and Sa2 are respectively turned on by the enabled clock signals CK_a1 and CK_a2. Two ends of the to-be-measured capacitor Cx are coupled to the node nd1 and for receiving the voltage Vf1, respectively. The voltage Vf1 is the grounding voltage, for example.

The control circuit 14 includes an output end OE2, a switch circuit SW2 and a known capacitor Cc, and is coupled to a node nd2. The switch circuit SW2 includes switches Sb1 and Sb2, wherein first ends of the switches Sb1 and Sb2 are coupled to the node nd2, and second ends of the switches Sb1 and Sb2 are for receiving a voltage Vf2 and coupled to the negative input end of the operational amplifier OP1, respectively. The switches Sb1 and Sb2 are respectively turned on by enabled clock signals CK_b1 and CK_b2. Two ends of the known capacitor Cc are respectively coupled to the node nd2 and for receiving the voltage Vf1. The voltage Vf2 is the highest voltage VDD, for example.

Figure 2:
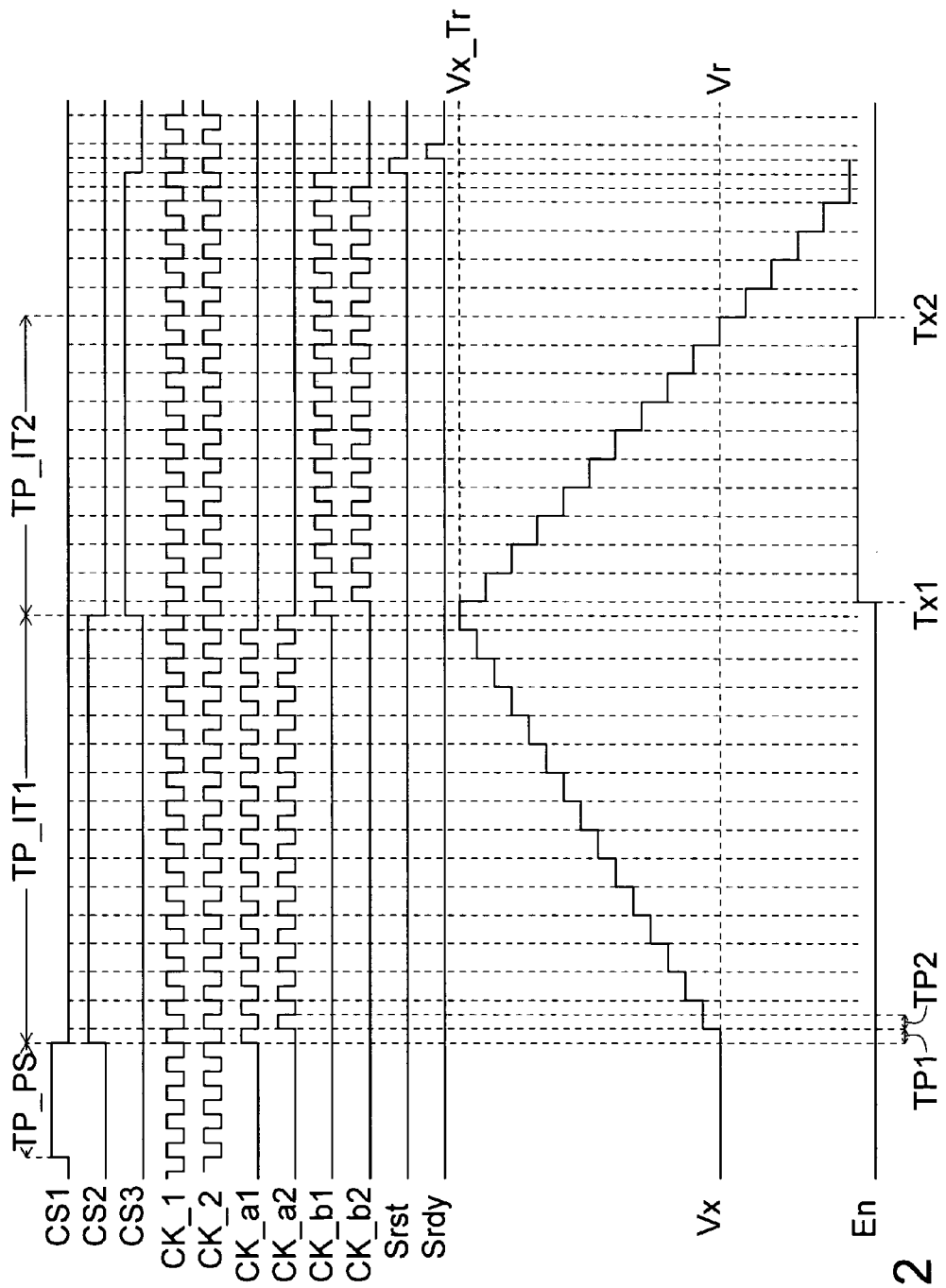
FIG. 2 is a timing chart showing timings of associated signals in the capacitance measurement circuit 10 of FIG. 1.

FIG. 2 is a timing chart showing timings of associated signals in the capacitance measurement circuit 10 of FIG. 1. Referring to FIG. 2, the measurement circuit 10 of this embodiment includes operation periods, such as a voltage setting period TP_PS and integration periods TP_IT1 and TP_IT2. The processor circuit 18 generates a corresponding control signal in the corresponding operation period to control the timing of the measurement circuit 10.

More specifically, the processor circuit 18 enables the control signal CS1 to turn on the switch Sc in the voltage setting period TP_PS. Thus, the negative input end and the output end ndo of the operational amplifier OP1 are electrically coupled to each other so that the operational amplifier OP1 is substantially connected as a unit gain buffer. The positive input end and the output end ndo of the operational amplifier OP1 have substantially the same voltage (=reference voltage Vr). In addition, the positive and negative input ends of the operational amplifier OP1 have the virtual short-circuited property. Thus, the levels on the positive and negative input ends and the output end ndo of the operational amplifier OP1 are set to the reference voltage Vr in the voltage setting period TP_PS. In the voltage setting period TP_PS, the clock signals CK_a1, CK_a2, CK_b1 and CK_b2 are continuously disabled so that the switches Sa1, Sa2, Sb1 and Sb2 are turned off. For example, the enabled level of the control signal CS1 is a high level; and the disabled levels of the clock signals CK_a1, CK_a2, CK_b1 and CK_b2 are low levels.

In the integration period TP_IT1, the processor circuit 18 provides the clock signals CK_a1 and CK_a2, and the levels of the clock signals CK_a1 and CK_a2 provided by are periodically switched between the high level and the low level to correspondingly turn on the switches Sa1 and Sa2.

For example, the switches Sa1 and Sa2 are respectively turned on and off in a first sub-operation period TP1. Thus, the voltage of the node nd1 is set to the grounding voltage so that a crossover voltage between two ends of the to-be-measured capacitor Cx is substantially equal to 0, and a crossover voltage between two ends of the integrating capacitor Ci is also equal to 0. In a second sub-operation period TP2, the switches Sa1 and Sa2 are respectively turned off and on, and the node nd1 is coupled to the negative input end of the operational amplifier OP1. Because the node ndi between the to-be-measured capacitor Cx and the integrating capacitor Ci (i.e., the negative input end of the operational amplifier OP1) is floating, the total charges stored in the to-be-measured capacitor Cx and the integrating capacitor Ci in the first sub-operation period TP1 are substantially equal to the total charges stored in the second sub-operation period TP2. That is, the following equation is satisfied:

$$Cx \times (Vf1 - Vf1) + Ci \times [Vr - Vx(t0)] = Cx \times Vr + Ci \times [Vr - Vx(t1)],$$

wherein the left portion of the equation represents the total charges stored in the to-be-measured capacitor Cx and the integrating capacitor Ci in the first sub-operation period TP1, and the right portion of the equation represents the total charges stored in the to-be-measured capacitor Cx and the integrating capacitor Ci in the second sub-operation period TP2. The voltage Vx(t0) represents the start voltage level of the integrated voltage Vx, and the voltage Vx(t1) represents the voltage generated after the integrated voltage Vx is integrated once. Because the integrated voltage Vx(t0) in the first sub-operation period TP1 is substantially equal to the reference voltage Vr (i.e., substantially equal to the voltage VDD/2), it is derived, according to the above-mentioned equation, that:

$$Vx(t1) = \frac{Cx + Ci}{Ci} \times Vr = \frac{VDD \times (Cx + Ci)}{2 \times Ci}, \text{ and}$$

$$\Delta V1 = Vx(t1) - Vx(t0) = \frac{VDD \times (Cx + Ci)}{2 \times Ci} - Vr = \frac{VDD \times Cx}{2 \times Ci}.$$

According to the above-mentioned derivation, it is obtained that the integrated voltage Vx is substantially increased by a voltage difference $\Delta V1$ after one integration operation is performed. The integration period TP_IT1 of this embodiment includes, for example, a period of N clock signals CK_a1 (i.e., N first sub-operation periods and N second sub-operation periods), the control circuit 12 and the integrator circuit 16 perform similar integrating operations in the period of each clock signal CK_a1, wherein N is a natural number. Thus, N integrating operations are performed repeatedly, and the integrated voltage Vx is increased from its start voltage level (equal to the level of the reference voltage Vr) to the end voltage level Vx_Tr:

$$Vx\_Tr = Vr + N \times \Delta V1 = Vr + N \times \frac{VDD \times Cx}{2 \times Ci}.$$

In the integration period TP_IT2, the processor circuit 18 provides clock signals CK_b1 and CK_b2 to drive the control circuit 14 to perform the operation similar to that of the control circuit 12 and thus to integrate the integrated voltage Vx. The difference between the operations of the control circuits 12 and 14 is that the switch Sb1 receives the voltage Vf2 (i.e., the highest voltage VDD) so that the integrated voltage difference $\Delta V2$ is equal to a negative value when the control circuit 14 is in the integration operation. Thus, the integrated voltage Vx is decreased from the end voltage level Vx_Tr to the start voltage (i.e., the level of the reference voltage Vr) of the integrated voltage Vx. The voltage difference $\Delta V2$ satisfies the equation:

$$\Delta V2 = -\frac{VDD \times Cc}{2 \times Ci}.$$

According to the above-mentioned derivation, it is obtained that the integrated voltage Vx is lowered by one voltage difference $\Delta V2$ in one integration operation. The integration period TP_IT2 of this embodiment includes, for example, the periods of M clock signals CK_b1. In each period of the clock signal CK_b1, the control circuit 14 and the integrator circuit 16 perform similar integrating operations, wherein M is a natural number. Thus, the integrating operation is performed M times repeatedly, and the integrated voltage Vx is lowered from its end voltage level Vx_Tr to the start voltage level. That is, the following equation is satisfied:

$$Vr = Vx\_Tr + M \times \Delta V2$$
$$= Vr + N \times \frac{VDD \times Cx}{2 \times Ci} + \left(-M \times \frac{VDD \times Cc}{2 \times Ci}\right).$$

The relationships among the to-be-measured capacitor Cx, M, N and the known capacitor Cc can be obtained after arrangement:

$$N \times \frac{VDD \times Cx}{2 \times Ci} = M \times \frac{VDD \times Cc}{2 \times Ci} \Rightarrow Cx = \frac{M}{N} Cc.$$

Thus, the processor circuit 18 further measures the capacitance of the to-be-measured capacitor Cx according to M, N and the capacitance of the known capacitor Cc and according to the above-mentioned equation.

Figure 3:
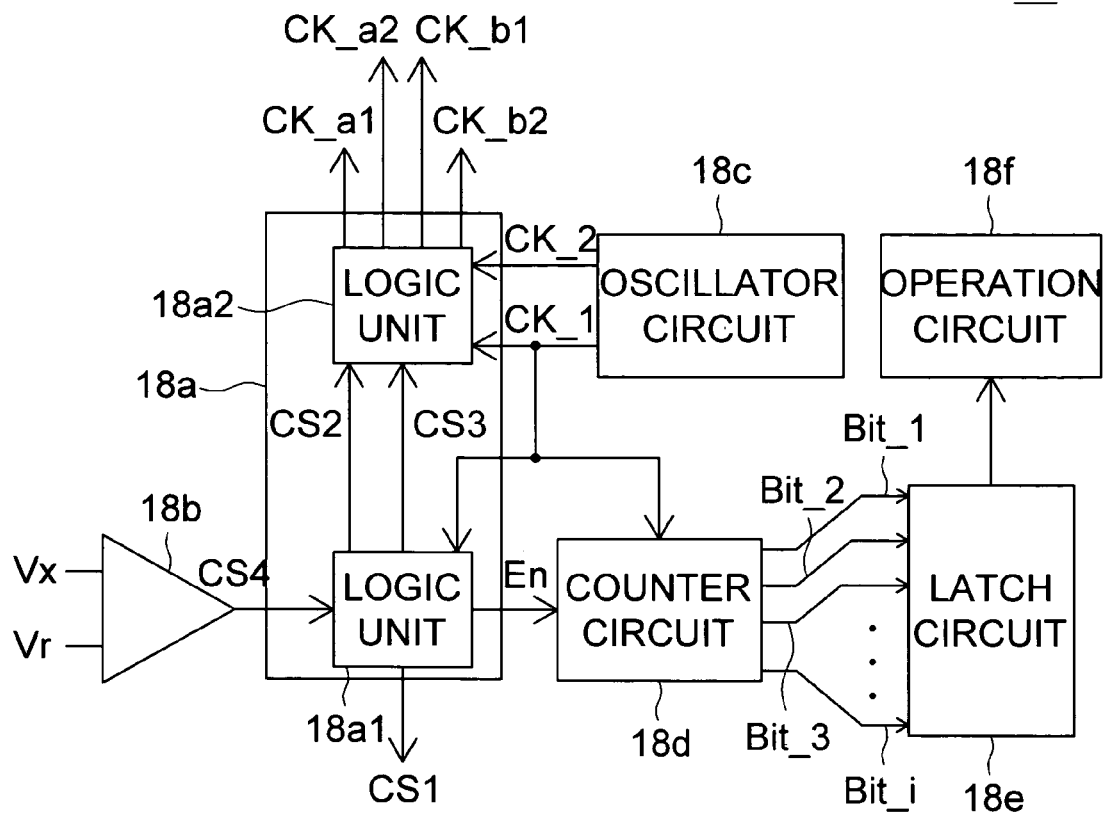
FIG. 3 is a detailed block diagram showing the processor circuit 18 of FIG. 1.

FIG. 3 is a detailed block diagram showing the processor circuit 18 of FIG. 1. Referring to FIG. 3 in detail, the processor circuit 18 includes a logic circuit 18a, a comparator circuit 18b, an oscillator circuit 18c, a counter circuit 18d, a latch circuit 18e and an operation circuit 18f. The logic circuit 18a includes logic units 18a1 and 18a2. The logic unit 18a2 generates the clock signals CK_a1 and CK_a2 in response to an enabled control signal CS2, and generates the clock signals CK_b1 and CK_b2 in response to an enabled control signal CS3.

Figure 4:
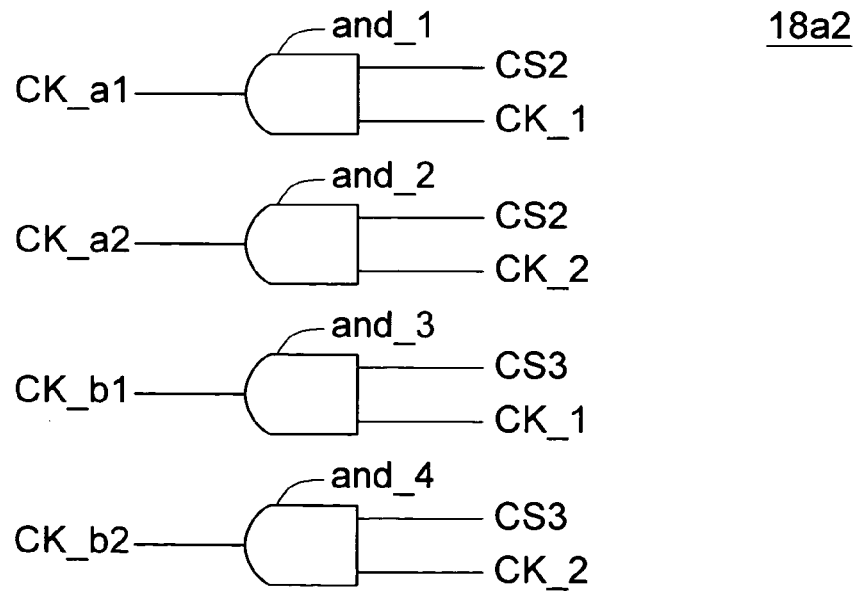
FIG. 4 is a detailed block diagram showing the logic unit 18a2 of FIG. 3.

For example, the detailed block diagram of the logic unit 18a2 is shown in FIG. 4. The logic unit 18a2 includes AND gates and_1, and_2, and_3 and and_4, which respectively receive the control signal CS2 and the clock signal CK_1, the control signal CS2 and the clock signal CK_2, the control signal CS3 and the clock signal CK_1 and the control signal CS3 and the clock signal CK_2 and correspondingly output the clock signals CK_a1, CK_a2, CK_b1 and CK_b2. The clock signals CK_1 and CK_2 are generated by the oscillating oscillator circuit 18c.

The logic unit 18a1 generates the control signal CS1 to control the integrator circuit 16 to set the integrated voltage Vx to the reference voltage Vr in the voltage setting period TP_PS. The logic unit 18a1 respectively generates the enabled control signals CS2 and CS3 to control the logic unit 18a2 to generate the clock signals CK_a1 and CK_a2 and CK_b1 and CK_b2 in the integration periods TP_IT1 and TP_IT2. The logic unit 18a1 further records that the integration period TP_IT2 corresponds to how many cycle times of clock signals CK_1.

In this embodiment, the logic unit 18a1 determines the generation of the enabled control signal CS3 from a start time instant Tx1 of the integration period TP_IT2. The logic unit 18a1 further detects whether an operation event is triggered and determines an end time instant Tx2 of the integration period TP_IT2 in response to the operation event.

For example, the operation event is the event that the comparator circuit 18b generates the enabled control signal CS4. The comparator circuit 18b receives the integrated voltage Vx and the reference voltage Vr, compares the level of the integrated voltage Vx to the level of the reference voltage Vr, and correspondingly generates the control signal CS4. When the integrated voltage Vx is higher than the reference voltage Vr, the control signal CS4 is disabled. When the level of the integrated voltage Vx is substantially lower than the reference voltage Vr, the comparator circuit 18b enables the control signal CS4. Therefore, the logic unit 18a1 can effectively determine the end time instant Tx2 of the integration period TP_IT2 in response to the operation event triggered by the comparator circuit 18b.

In this embodiment, the logic unit 18a1 enables a driving signal En between the time instants Tx1 and Tx2 to drive the counter circuit 18d to perform a counting operation, in which a value M indicating the counted number of cycles, e.g., starting from zero, is increased by one for every cycle time of the clock signal CK_1 (equal to the cycle of the clock signal CK_b1). Thus, the processor circuit 18 of this embodiment can obtain the value M through the counting operation of the counter circuit 18d.

For example, the counter circuit 18d is an i-bit counter circuit for counting to generate and output i pieces of bit data Bit_1 to Bit_i of the value M to the latch circuit 18e. The latch circuit 18e receives and records the bit data Bit_1 to Bit_i. The operating unit 18f obtains the value M according to the bit data Bit_1 to Bit_i stored in the latch circuit 18e, and measures the capacitance of the to-be-measured capacitor Cx according to the relationships between the to-be-measured capacitor Cx, the values M, N and the known capacitor Cc.

In this embodiment, the logic unit 18a1 further sequentially generates a latch signal Srdy and a reset signal Srst after the integration period TP_IT2. Thus, the latch circuit 18e latches the output value of the counter circuit 18d in response to the latch signal Srdy. After the latch circuit 18e has latched the output value, the counter circuit 18d resets its count value in response to the reset signal Srst. After the latch circuit 18e and the counter circuit 18d have respectively finished the latch operation and the reset operation, the processor circuit 18 may perform the next measurement operation for the to-be-measured capacitor.

The logic unit 18a1 of this embodiment further records the value N, and determines how many cycles of the clock signals CK_1 is included in the integration period TP_IT1 according to the value N. In this embodiment, the value N (i.e., the number of cycles of the clock signals CK_a1 included in the integration period TP_IT1) is adjustable, and the user can make the measurement circuit 10 of this embodiment be suitable for the measurement of the to-be-measured capacitors Cx with different capacitance ranges by adjusting the value N.

Furthermore, it is obtained that the ratio of M/N is relevant to the ratio of the capacitance of the to-be-measured capacitor Cx to that of the known capacitor Cc according to equation:

$$Cx = \frac{M}{N} Cc.$$

Because the range of the value M is fixed (ranges from 0 to $2^i-1$), the user can adjust the measurement circuit 10 by adjusting the value N so that the measurement circuit 10 is adapted to the measurement operations of different to-be-measured capacitors Cx. For example, when the value N is set to (1/x) times of the maximum Mmax of M, it is obtained that the measurement circuit 10 can perform the capacitance measurement on the to-be-measured capacitor Cx having the capacitance smaller than or equal to x times of the capacitance of the known capacitor Cc, wherein x is a real number according to equation:

$$Cx = \frac{M}{N} \times Cc \Rightarrow \frac{Cx}{Cc} = \frac{M}{M\max/x} \leq \frac{M\max}{M\max/x} = x.$$

The maximum Mmax is equal to $2^i-1$. Thus, the user can determine the value N according to the substantial ratio of the capacitance of the to-be-measured capacitor Cx to the capacitance of the known capacitor Cc.

In this illustrated embodiment, although the end voltage level Vx_Tr of the integrated voltage Vx is higher than the start voltage level (equal to the level of the reference voltage Vr) of the integrated voltage Vx, the end voltage level Vx_Tr of this embodiment is not limited thereto. In another example, the end voltage level Vx_Tr is lower than the start voltage level. Thus, the integrated voltage Vx is decreased from the start voltage level to the end voltage level Vx_Tr and increased from the end voltage level Vx_Tr to the start voltage level in the first and second integration periods TP_IT1 and TP_IT2, respectively.

Figure 5:
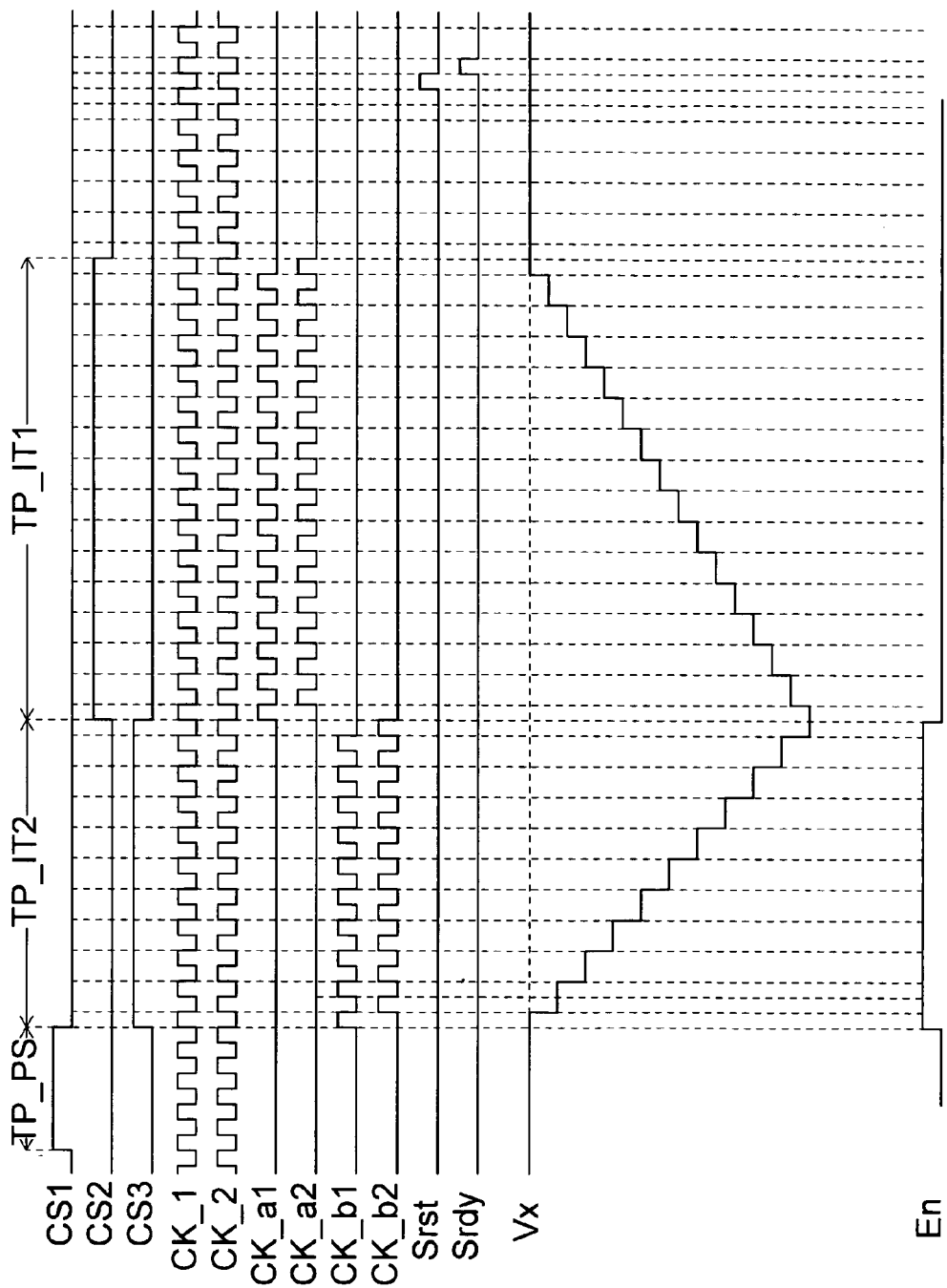
FIG. 5 is another timing chart showing associated signals in the capacitance measurement circuit 10 of FIG. 1.

In this illustrated embodiment, although the control circuits 12 and 14 sequentially control the integrator circuit 16 to perform the integration operations after the voltage setting period TP_PS, the measurement circuit 10 of this embodiment is not limited thereto. In another example, the control circuit 14 may first control the integrator circuit 16 to perform the integration operation, and then the control circuit 12 controls the integrator circuit 16 to perform the integration operation in this measurement circuit 10 of this embodiment, as shown in FIG. 5.

The measurement circuit of this embodiment utilizes the to-be-measured capacitor and the known capacitor to set the charge voltage from the start voltage level to the end voltage level, to set the charge voltage from the end voltage level to the start voltage level, and to determine the capacitance of the to-be-measured capacitor according to the number of corresponding clock cycles of the charge and discharge operations and the capacitance of the known capacitor. Thus, the user can adjust the range of the measurable capacitance of the to-be-measured capacitor by adjusting the number of corresponding clock cycles of the charge operations. Compared with the conventional capacitance measurement circuit, the capacitance measurement circuit according to this embodiment has the advantage of flexibly measuring difference ranges of the capacitance of the to-be-measured capacitor, and can effectively provide another design choice for the capacitance measurement circuit.

In addition, the capacitance measurement circuit according to this embodiment performs multiple times of integration operations in multiple clock cycles of the integration periods. Thus, the capacitance measurement circuit according to this embodiment can offset the influence of the circuit noise on the voltage difference in each integration operation by the accumulation of the greater number of times of the integrating operations, and can decrease the influence of the noise on the finally accumulated integrated voltage. Thus, the capacitance measurement circuit according to this embodiment can precisely determine the capacitance of the to-be-measured capacitor.

Second Embodiment

Figure 6:
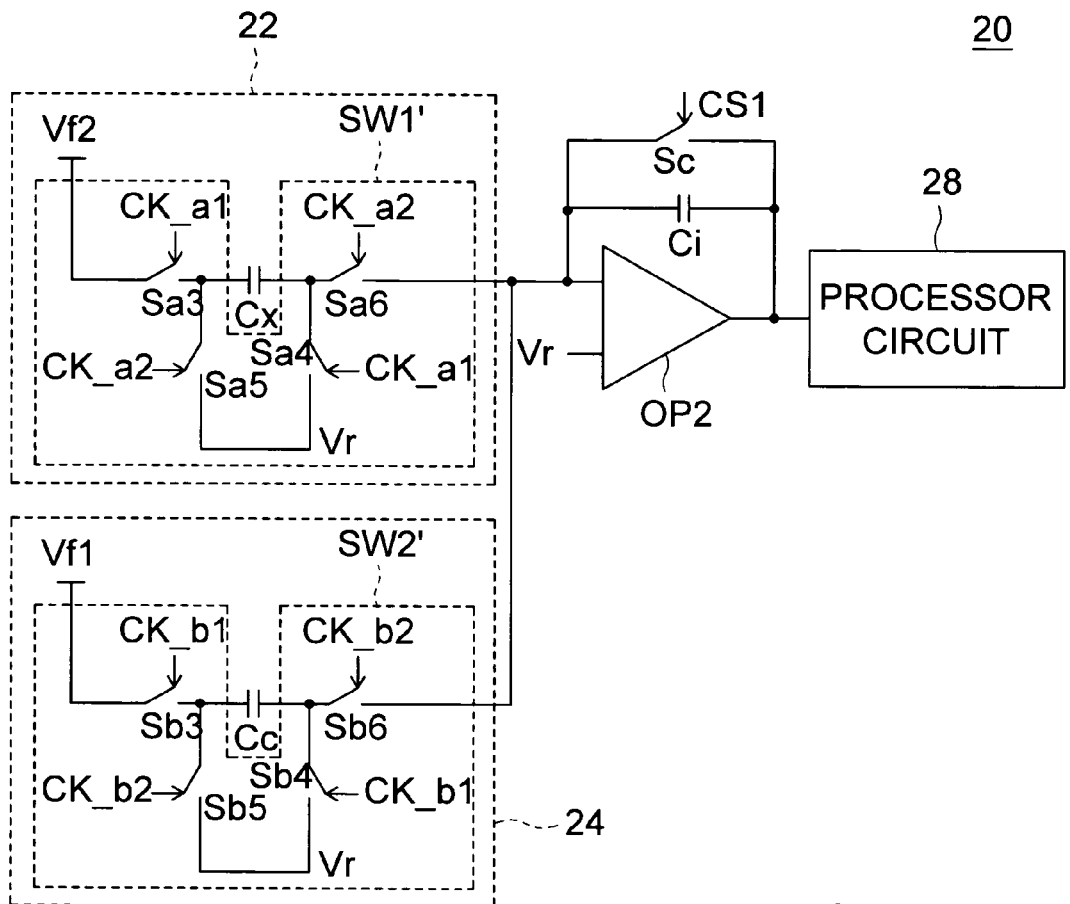
FIG. 6 is a block diagram showing a capacitance measurement circuit according to a second embodiment of the invention.

In the capacitance measurement circuit according to this embodiment, the switch circuit including four switches is utilized to implement the corresponding switch circuits in two control circuits. FIG. 6 is a block diagram showing a capacitance measurement circuit according to a second embodiment of the invention. As shown in FIG. 6, the difference between the capacitance measurement circuit according to this embodiment and the capacitance measurement circuit 10 according to the first embodiment is that the control circuits 22 and 24 have other circuit designs in the second embodiment.

The control circuit 22 includes a switch circuit SW1' and a to-be-measured capacitor Cx, wherein the switch circuit SW1' includes switches Sa3, Sa4, Sa5 and Sa6. First ends of the switches Sa3 and Sa5 are coupled to the first end of the to-be-measured capacitor Cx, and second ends of the switches Sa3 and Sa5 respectively receive the voltage Vf2 and the reference voltage Vr. First ends of the switches Sa4 and Sa6 are coupled to the second end of a to-be-measured capacitor, and second ends of the switches Sa4 and Sa6 are for receiving the reference voltage Vr and coupled to a negative input end of an operational amplifier OP2, respectively. For example, the voltage Vf2 is equal to the highest voltage VDD, and the reference voltage Vr is equal to one half of the highest voltage VDD.

The switches Sa3 and Sa4 are turned on in the first sub-operation period in response to the clock signal CK_a1 so that the first and second ends of the to-be-measured capacitor Cx respectively receive the voltage Vf2 and the reference voltage Vr. The switches Sa5 and Sa6 are turned on in the second sub-operation period in response to the clock signal CK_a2 so that the first and second ends of the to-be-measured capacitor Cx are for receiving the reference voltage Vr and coupled to the negative input end of the operational amplifier OP2, respectively. In the second sub-operation period, the node between the second end of the to-be-measured capacitor Cx and the integrating capacitor Ci (i.e., the negative input end of the operational amplifier OP2) is floating, and the total charges stored in the to-be-measured capacitor Cx and the integrating capacitor Ci in the first sub-operation period are substantially equal to the total charges stored in the second sub-operation period. That is, the following equation is satisfied:

$$Cx \times (Vr - Vf2) + Ci \times [Vr - Vx(t0)] = Cx \times (Vr - Vr) + Ci \times [Vr - Vx(t1)].$$

According to the above-mentioned equation, the results the same as those of the first embodiment can be derived:

$$Vx(t1) = \frac{Cx + Ci}{Ci} \times Vr = \frac{VDD \times (Cx + Ci)}{2 \times Ci},$$

$$\Delta V1 = Vx(t1) - Vx(t0) = \frac{VDD \times (Cx + Ci)}{2 \times Ci} - Vr = \frac{VDD \times Cx}{2 \times Ci},$$

and $$Vx\_Tr = Vr + N \times \Delta V1 = Vr + N \times \frac{VDD \times Cx}{2 \times Ci}.$$

The control circuit 24 includes a switch circuit SW2' and a known capacitor Cc, wherein the switch circuit SW2' includes switches Sb3, Sb4, Sb5 and Sb6. The operation of the control circuit 24 may be similarly obtained according to the operation of the control circuit 22 and the operation of the control circuit 14 of the first embodiment. According to the above-mentioned description, it is obtained that the capacitance measurement circuit according to this embodiment has the advantages of flexibly measuring different capacitance ranges of the to-be-measured capacitors, of effectively providing another design choice for the capacitance measurement circuit, and of precisely measuring the capacitance of the to-be-measured capacitor.

Third Embodiment

Figure 7:
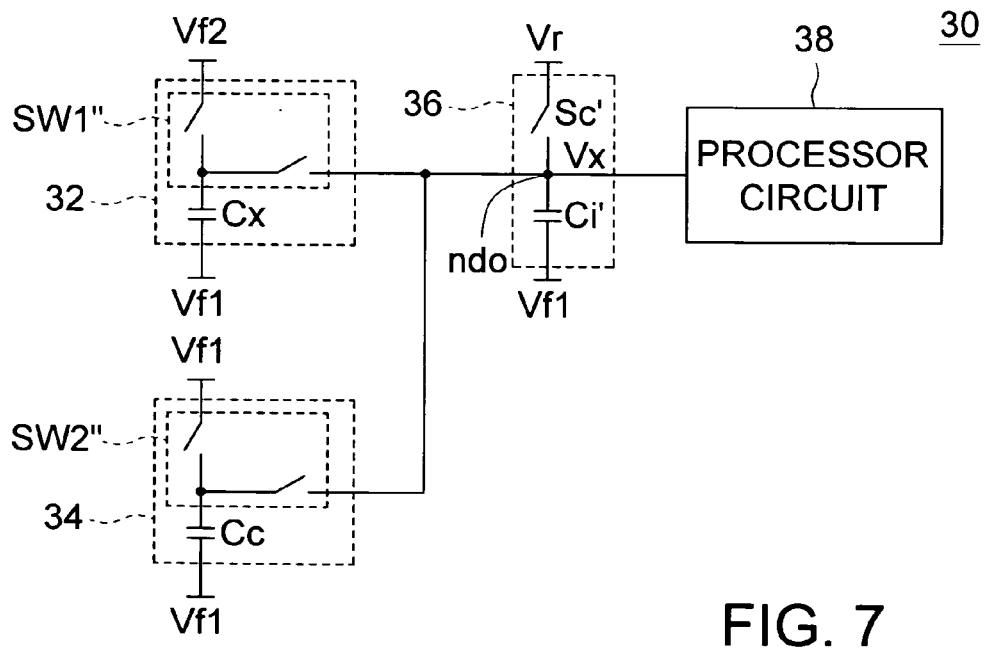
FIG. 7 is a block diagram showing a capacitance measurement circuit according to a third embodiment of the invention.

In the capacitance measurement circuit according to this embodiment, the integrator circuit is implemented using a serial circuit including an integrating capacitor and a switch. FIG. 7 is a block diagram showing a capacitance measurement circuit 30 according to a third embodiment of the invention. As shown in FIG. 7, the difference between the capacitance measurement circuit 30 of this embodiment and the capacitance measurement circuits 10 and 20 of the first and second embodiments is that the operational amplifier is omitted from the integrator circuit 36 of the capacitance measurement circuit 30, and a serial circuit including an integrating capacitor Ci' and a switch Sc' is directly used. First ends of the integrating capacitor Ci' and the switch Sc' are coupled to each other at a node having a voltage equal to the integrated voltage Vx. Second ends of the integrating capacitor Ci' and the switch Sc' respectively receive the voltages Vf1 and Vr. For example, the voltages Vf1 and Vr are respectively the grounding voltage and one half of the highest voltage VDD. The differences between the control circuits 32 and 34 of this embodiment and the corresponding control circuits 12 and 14 of the capacitance measurement circuit 10 of the first embodiment are that the voltages received by the switch circuits SW1" and SW2" are respectively changed to the voltages Vf2 and Vf1.

Figure 8:
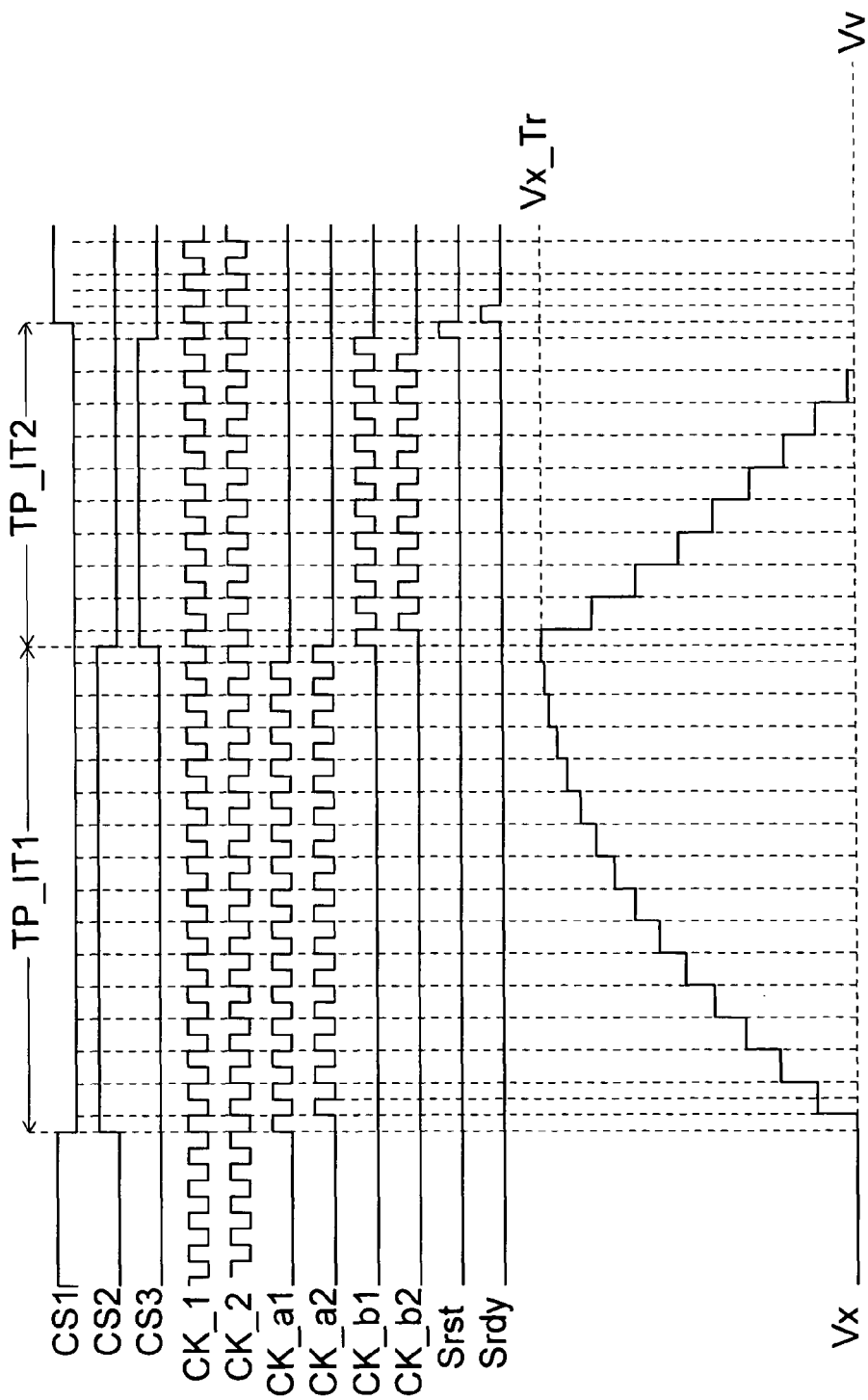
FIG. 8 is a timing chart showing timings of associated signals in the capacitance measurement circuit 30 of FIG. 7.

FIG. 8 is a timing chart showing timings of associated signals in the capacitance measurement circuit 30 of FIG. 7. Because the operational amplifier is omitted from the integrator circuit 36, the increased and decreased voltage differences $\Delta V1$ and $\Delta V2$ of the integrated voltage Vx in each integration operation of this embodiment are not constant, and are substantially associated with a geometric series.

More specifically, the start integrated voltage Vx(t0) (equal to the reference voltage Vr) and the integrated voltage Vx(t1)

after the first integration operation is performed in the integration period TP_IT1 satisfies the equation:

$$Cx \times (Vf2-Vf1)+Ci' \times [Vx(t0)-Vf1]=Cx \times (Vx(t1)-Vf1)+Ci' \times [Vx(t1)-Vf1],$$

wherein the voltages Vf1 and Vf2 are respectively equal to the grounding voltage and the highest voltage VDD. Thus, it is obtained, according to the above-mentioned equation, that:

$$Vx(t1) = \frac{VDD}{2} + \frac{Cx \times VDD}{2 \times (Cx+Ci')}.$$

According to the similar method, it is derived that:

$$Vx(t2) = \frac{VDD}{2} + \frac{Cx \times VDD}{2 \times (Cx+Ci')} + \frac{Cx \times VDD \times Ci'}{2 \times (Cx+Ci')^2}.$$

According to the above-mentioned similar condition with the assumption that the control circuit 32 and the integrator circuit 36 of this embodiment perform N integration operations in the integration period TP_IT1, the integrated voltage Vx(tN) obtained after the N integration operations are performed and when the integration period TP_IT1 elapses is equal to:

$$Vx(tN) = \frac{VDD}{2} + \sum_{x=1}^{N} \frac{VDD \times Cx \times (Ci')^{x-1}}{2 \times (Cx+Ci')^x}.$$

Similarly, it is assumed that the control circuit 34 and the integrator circuit 36 of this embodiment perform M integration operations in the integration period TP_IT2, and the integrated voltage Vx(tM) after the M integration operations are performed when the integration period TP_IT2 elapses is equal to:

$$Vx(tM) = \left[\frac{VDD}{2} + \sum_{x=1}^{N} \frac{VDD \times Cx \times (Ci')^{x-1}}{(Cx+Ci')^x}\right] \times$$

$$\left[1 - \sum_{y=1}^{M} \frac{Cc \times (Ci')^{y-1}}{(Cc+Ci')^y}\right] \cong \frac{VDD}{2}.$$

The relationships between the to-be-measured capacitor Cx, the known capacitor Cc, the integrating capacitor Ci', and values N and M can be derived according to the above-mentioned equation:

$$\sum_{x=1}^{N} \frac{Cx \times (Ci')^{x-1}}{(Cx+Ci')^x} \cong \frac{\sum_{y=1}^{M} \frac{Cc \times (Ci')^{y-1}}{(Cc+Ci')^y}}{1 - \sum_{y=1}^{M} \frac{Cc \times (Ci')^{y-1}}{(Cc+Ci')^y}}.$$

The processor circuit 38 of this embodiment determines the capacitance of the to-be-measured capacitor Cx according to a look-up table which is constructed from relationships between the to-be-measured capacitor Cx, the known capacitor Cc, the integrating capacitor Ci', and the values N and M of the above-mentioned equation. Thus, the capacitance measurement circuit 30 of this embodiment may also effectively determine the capacitance of the to-be-measured capacitor Cx.

In another example, when the following conditions are satisfied:

$$Ci' \gg Cx; \ Ci' \gg Cc; \ M \times \frac{Cc}{Ci'} \ll 1,$$

the above-mentioned relationships may be simplified as:

$$\sum_{x=1}^{N} \frac{Cx}{Ci'} \cong \frac{\sum_{y=1}^{M} \frac{Cc}{Ci'}}{1 - \sum_{y=1}^{M} \frac{Cc}{Ci'}} \Rightarrow$$

$$N\frac{Cx}{Ci'} \cong \frac{M \times \frac{Cc}{Ci'}}{1 - M \times \frac{Cc}{Ci'}} \Rightarrow N \times \frac{Cx}{Ci'} \cong M \times \frac{Cc}{Ci'} \Rightarrow Cx = \frac{M}{N} Cc.$$

Thus, in this example, the capacitance measurement circuit 30 of this embodiment may also derive the capacitance of the to-be-measured capacitor Cx according to the relationships substantially the same as those of the first and second embodiments. According to the above-mentioned descriptions, it is obtained that the capacitance measurement circuit according to this embodiment has the advantages of flexibly measuring different ranges of capacitances of the to-be-measured capacitors, of effectively providing another design choice for the capacitance measurement circuit, and of precisely measuring the capacitance of the to-be-measured capacitor.

Fourth Embodiment

Figure 9:
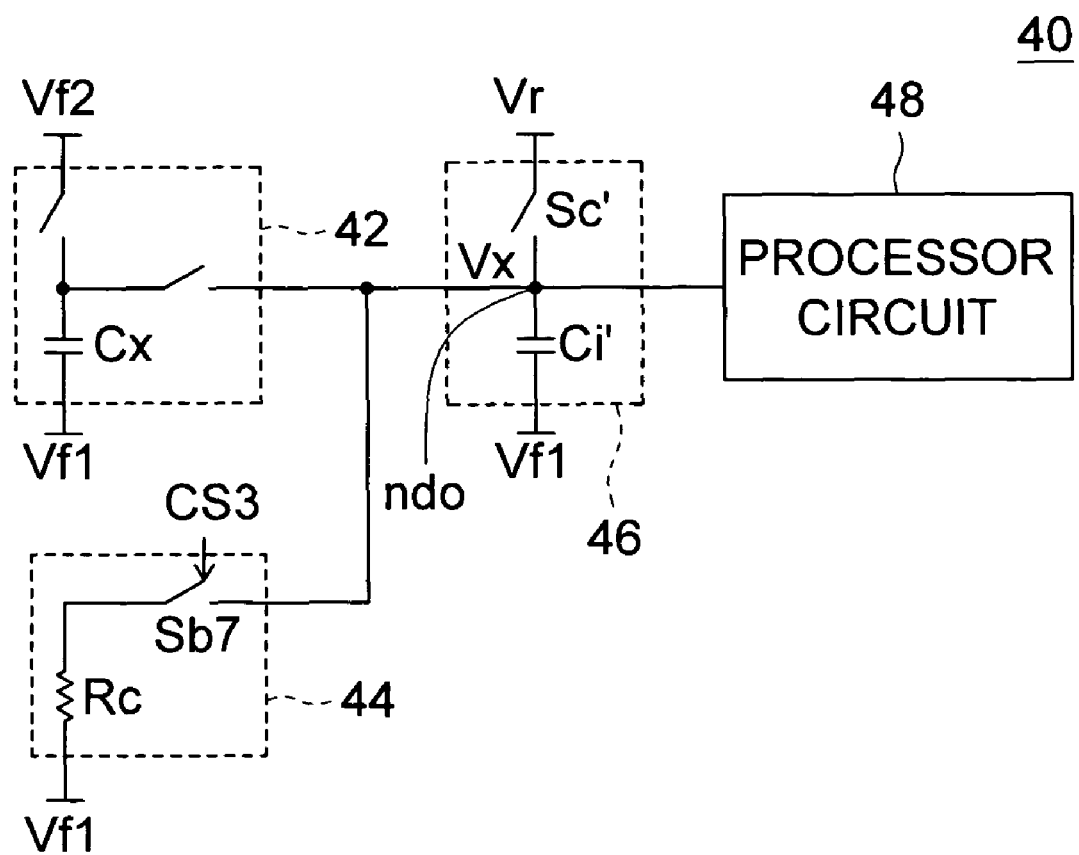
FIG. 9 is a block diagram showing a capacitance measurement circuit according to a fourth embodiment of the invention.
Figure 10:
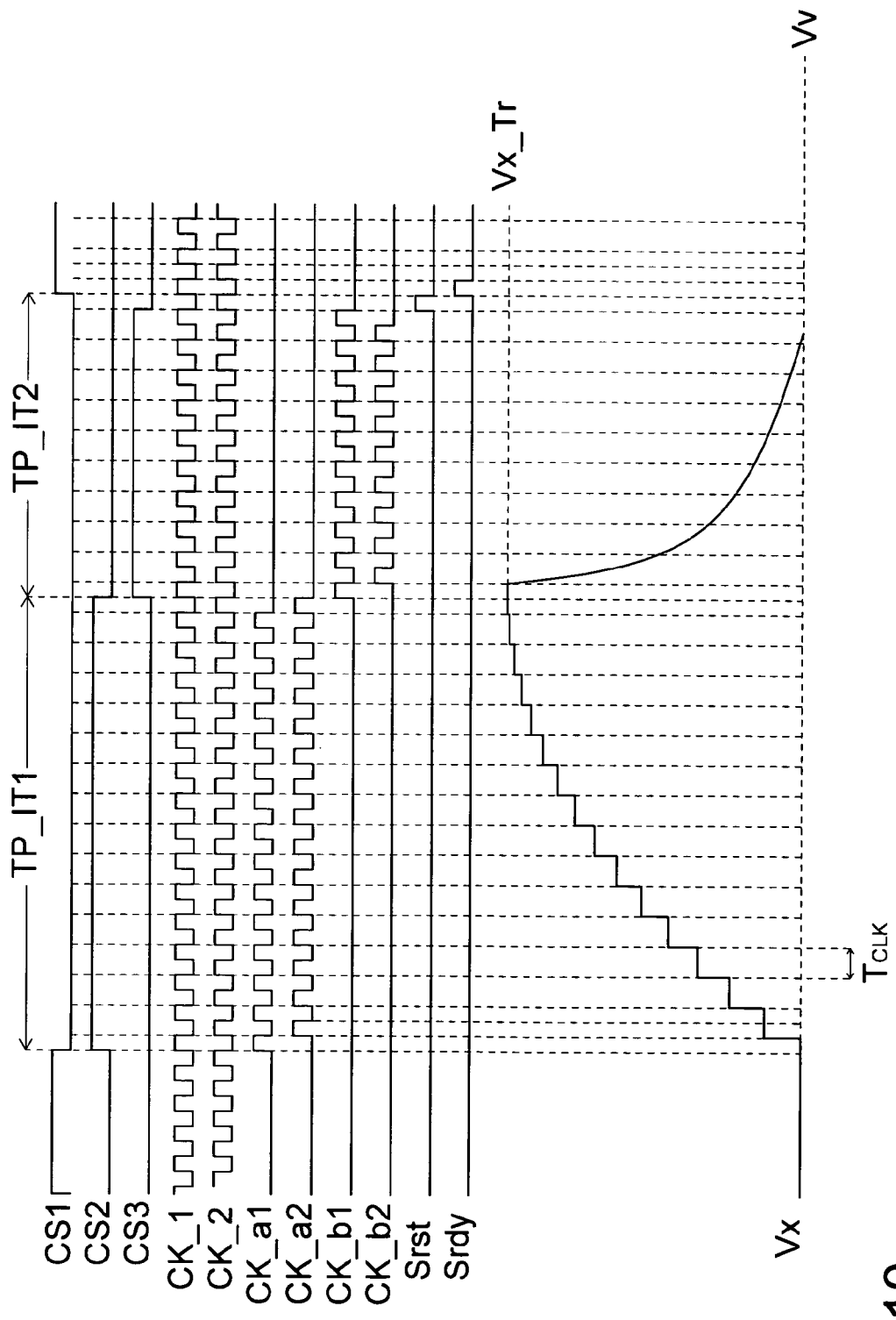
FIG. 10 is a timing chart showing timings of associated signals in the capacitance measurement circuit of FIG. 9.

In the capacitance measurement circuit according to this embodiment, the control circuit for controlling the integrator circuit to perform the discharge integration operation is implemented by using an integrating resistor and a switch. FIG. 9 is a block diagram showing a capacitance measurement circuit according to a fourth embodiment of the invention. FIG. 10 is a timing chart showing timings of associated signals in the capacitance measurement circuit of FIG. 9. As shown in FIGS. 9 and 10, the difference between the capacitance measurement circuit according to this embodiment and the capacitance measurement circuit 30 of the third embodiment is that the known capacitor Cc and the switch circuit SW2 of the third embodiment are replaced with a known resistor Rc and a switch Sb7 in the control circuit 44 of this embodiment. First ends of the known resistor Rc and the switch Sb7 are coupled to each other, and second ends of the known resistor Rc and the switch Sb7 are for receiving voltage Vf1 and coupled to the connection point between the integrating capacitor Ci' and the switch Sc', respectively. For example, the voltage Vf1 is the grounding voltage. The switch Sb7 operates under the control of the control signal CS3.

In the integration period TP_IT2, the control signal CS3 is enabled to turn on the switch Sb7. Thus, the control circuit 44 substantially forms a discharge path to discharge the integrated voltage Vx, and the curve of the integrated voltage Vx is a continuous capacitor-resistor discharge curve. It is assumed that the control circuit 42 and the integrator circuit 46 of this embodiment perform N integration operations in the integration period TP_IT1. The integrated voltage Vx(tN) obtained after the N integration operations are performed when the integration period TP_IT1 elapses is equal to:

$$Vx(tN) = \frac{VDD}{2} + \sum_{x=1}^{N} \frac{VDD \times Cx \times (Ci')^{x-1}}{2 \times (Cx + Ci')^x}.$$

Similarly, it is assumed that the control circuit 44 and the integrator circuit 46 of this embodiment perform M integration operations in the integration period TP_IT2. The integrated voltage Vx(tM) obtained after the M integration operations are performed when the integration period TP_IT2 elapses is equal to:

$$Vx(tM) = Vx(tN) \times e^{-\frac{M \times T_{CLK}}{Rc \times (Cx+Ci')}} \cong \frac{VDD}{2},$$

wherein TCLK is the cycle of the clock signal CK_1. According to the above-mentioned derivation, the relationships between the to-be-measured capacitor Cx, the values M, N and the known capacitor Cc can be derived as:

$$\sum_{x=1}^{N} \frac{Cx \times (Ci')^{x-1}}{(Cx+Ci')^x} \cong e^{\frac{M \times T_{CLK}}{Rc \times (Cx+Ci')}} - 1.$$

Similar to the third embodiment, the processor circuit 48 of this embodiment determines the capacitance of the to-be-measured capacitor Cx according to a look-up table which is constructed from relationships between the to-be-measured capacitor Cx, the known resistor Rc, the integrating capacitor Ci', and the values N and M of the above-mentioned equation. Thus, the capacitance measurement circuit 40 according to this embodiment may also effectively determine the capacitance of the to-be-measured capacitor Cx.

In another example, when the following equation is satisfied:

$$Ci' >> Cx \text{ and } M \times T_{CLK} << Rc \times Ci',$$

the relationships between the to-be-measured capacitor Cx, the known resistor Rc, the integrating capacitor Ci' and the values N and M may be simplified as:

$$N \times Cx = \frac{M \times T_{CLK}}{Rc} \Rightarrow Cx = \frac{M \times T_{CLK}}{N \times Rc}.$$

Therefore, in this example, the capacitance measurement circuit 40 according to this embodiment may also derive the capacitance of the to-be-measured capacitor Cx according to the relationships substantially the same as those of the first and second embodiments. According to the above-mentioned description, it is obtained that the capacitance measurement circuit according to this embodiment has the advantages of flexibly measuring different capacitance ranges of the to-be-measured capacitors, of effectively providing another design choice for the capacitance measurement circuit, and of precisely measuring the capacitance of the to-be-measured capacitor.

Fifth Embodiment

Figure 11:
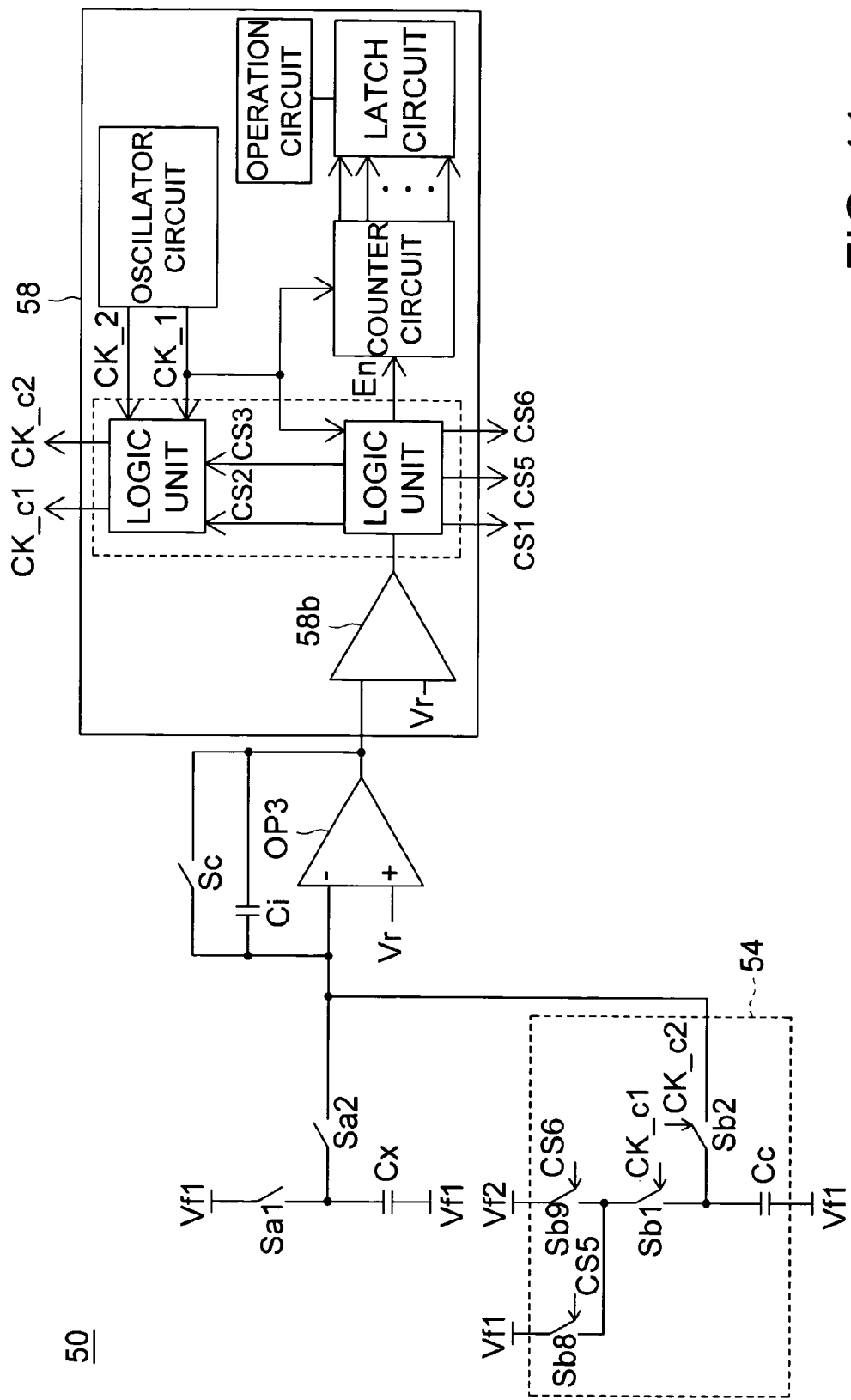
FIG. 11 is a block diagram showing a capacitance measurement circuit according to a fifth embodiment of the invention.
Figure 12:
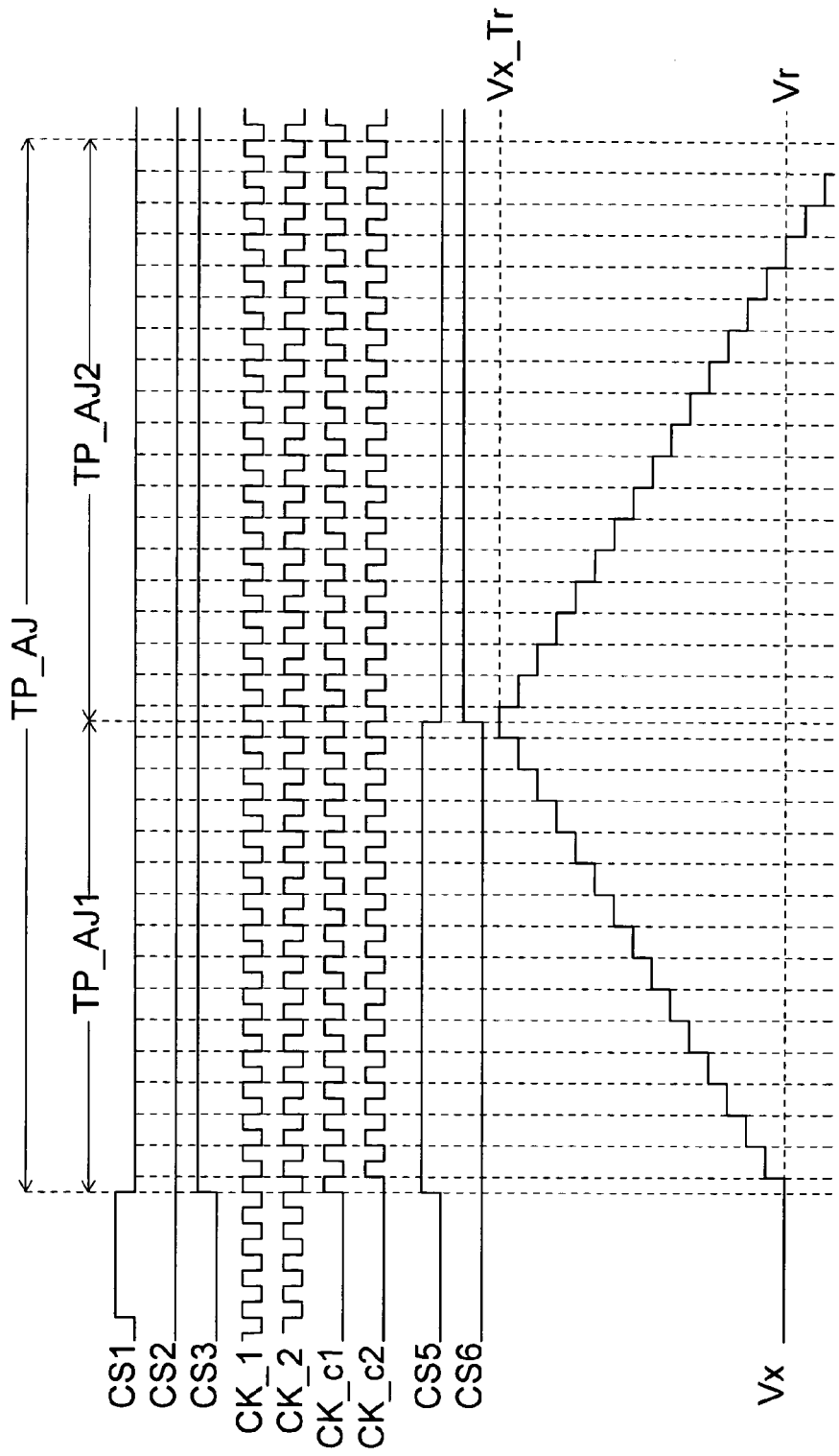
FIG. 12 is a timing chart showing timings of associated signals in the capacitance measurement circuit of FIG. 11.

The capacitance measurement circuit according to this embodiment has an error calibration circuit for performing the offset voltage correction operations on the operational amplifier and the comparator in the capacitance measurement circuit. FIG. 11 is a block diagram showing a capacitance measurement circuit 50 according to a fifth embodiment of the invention. FIG. 12 is a timing chart showing timings of associated signals in the capacitance measurement circuit of FIG. 11.

As shown in FIGS. 11 and 12, the difference between the capacitance measurement circuit 50 according to this embodiment and the measurement circuit 10 of the first embodiment is that the control circuit 54 of this embodiment further includes switches Sb8 and Sb9, and the processor circuit 58 of the measurement circuit 50 further generates the control signals CS5 and CS6 and the clock signals CK_c1 and CK_c2 to respectively control the switches Sb8, Sb9, Sb1 and Sb2 in a correction period TP_AJ.

Before the correction period TP_AJ, the processor circuit 58 also generates the control signal CS1 to set the integrated voltage Vx to a voltage approaching the reference voltage Vr. In the correction period TP_AJ, the clock signals CK_c1 and CK_c2 are periodically switched between the high level and the low level to periodically turn on the switches Sb1 and Sb2. The clock signals CK_c1 and CK_c2 have inverse phases and have the frequency equal to that of the clock signal CK_1.

The correction period TP_AJ includes correction sub-periods TP_AJ1 and TP_AJ2. In the correction sub-period TP_AJ1, the control signal CS5 is enabled to turn on the switch Sb8. Thus, in the correction sub-period TP_AJ1, the control circuit 54 has the operation similar to that of the control circuit 12 of the first embodiment in order to increase the integrated voltage Vx from the start voltage level (equal to the level of the reference voltage Vr) to the end voltage level Vx_Tr. The difference between the control circuits 54 and 12 is that the control circuit 54 performs the integration operation on the integrated voltage Vx through the known capacitor Cc. Thus, the voltage difference ΔV3 and the end voltage level Vx_Tr of the integrated voltage Vx in each integration operation respectively satisfy the equations:

$$\Delta V3 = \frac{VDD \times Cc}{2 \times Ci}, \text{ and}$$

$$Vx\_Tr = Vx(t0) + N' \times \Delta V3 = Vx(t0) + N' \times \frac{VDD \times Cc}{2 \times Ci},$$

wherein Vx(t0) is the initial value of the integrated voltage Vx when the correction operations in the correction sub-periods TP_AJ1 and TP_AJ2 are not performed on the integrated voltage Vx.

In the correction sub-period TP_AJ2, the control signal CS6 is enabled to turn on the switch Sb9. Therefore, the control circuit 54 has the operation similar to that of the control circuit 14 of the first embodiment in the correction sub-period TP_AJ2 so as to lower down the integrated voltage Vx from the end voltage level Vx_Tr. Consequently, the voltage difference ΔV4 of the integrated voltage Vx in each integration operation and the final integrated voltage Vx(tM')

obtained after M' integration operations are performed on the integrated voltage Vx respectively satisfy the equations:

$$\Delta V4 = -\frac{VDD \times Cc}{2 \times Ci}, \text{ and}$$

$$Vx(tM') = Vx\_Tr + M' \times \Delta V4$$
$$= Vx(t0) + N' \times \frac{VDD \times Cc}{2 \times Ci} + \left(-M' \times \frac{VDD \times Cc}{2 \times Ci}\right)$$

$$\Rightarrow Vx(tM') - Vx(t0) = \left[(N' - M') \times \frac{VDD \times Cc}{2 \times Ci}\right].$$

In the condition where the operational amplifier OP3 and the comparator circuit 58b are ideal, the integrated voltage Vx(t0) and the finally integrated voltage Vx(tM') are equal to the reference voltage Vr, and the values M' and N' are substantially the same. However, when an offset voltage exists between the positive and negative input ends of the operational amplifier OP3 or between two ends of the comparator circuit 58b, values M' and N' are not equal to each other. For example, when an offset voltage Vof1 exists between the positive and negative input ends of the operational amplifier OP3, and an offset voltage Vof2 exists between two ends of the comparator circuit 58b, the integrated voltage Vx(t0) and the final integrated voltage Vx(tM') are respectively equal to:

$$Vx(t0) = Vr + Vof1$$

$$Vx(tM') = Vr - Vof2$$

At this time, the relationship between the integrated voltage Vx(t0) and the final integrated voltage Vx(tM') is written as:

$$Vx(tM') - Vx(t0) = (Vr + Vof1) - (Vr - Vof2)$$
$$= \left[(N' - M') \times \frac{VDD \times Cc}{2 \times Ci}\right]$$

$$\Rightarrow Vof1 + Vof2 = \left[(N' - M') \times \frac{VDD \times Cc}{2 \times Ci}\right] = D \times \frac{VDD \times Cc}{2 \times Ci}$$

Thus, the difference D corresponding to a sum of the offset voltages Vof1 and Vof2 may be obtained through the above-mentioned operation. In the subsequently normal operation, the recorded value M and the difference D are summed so that the offset voltage correction operation can be performed on the operational amplifier OP3.

Figure 13:
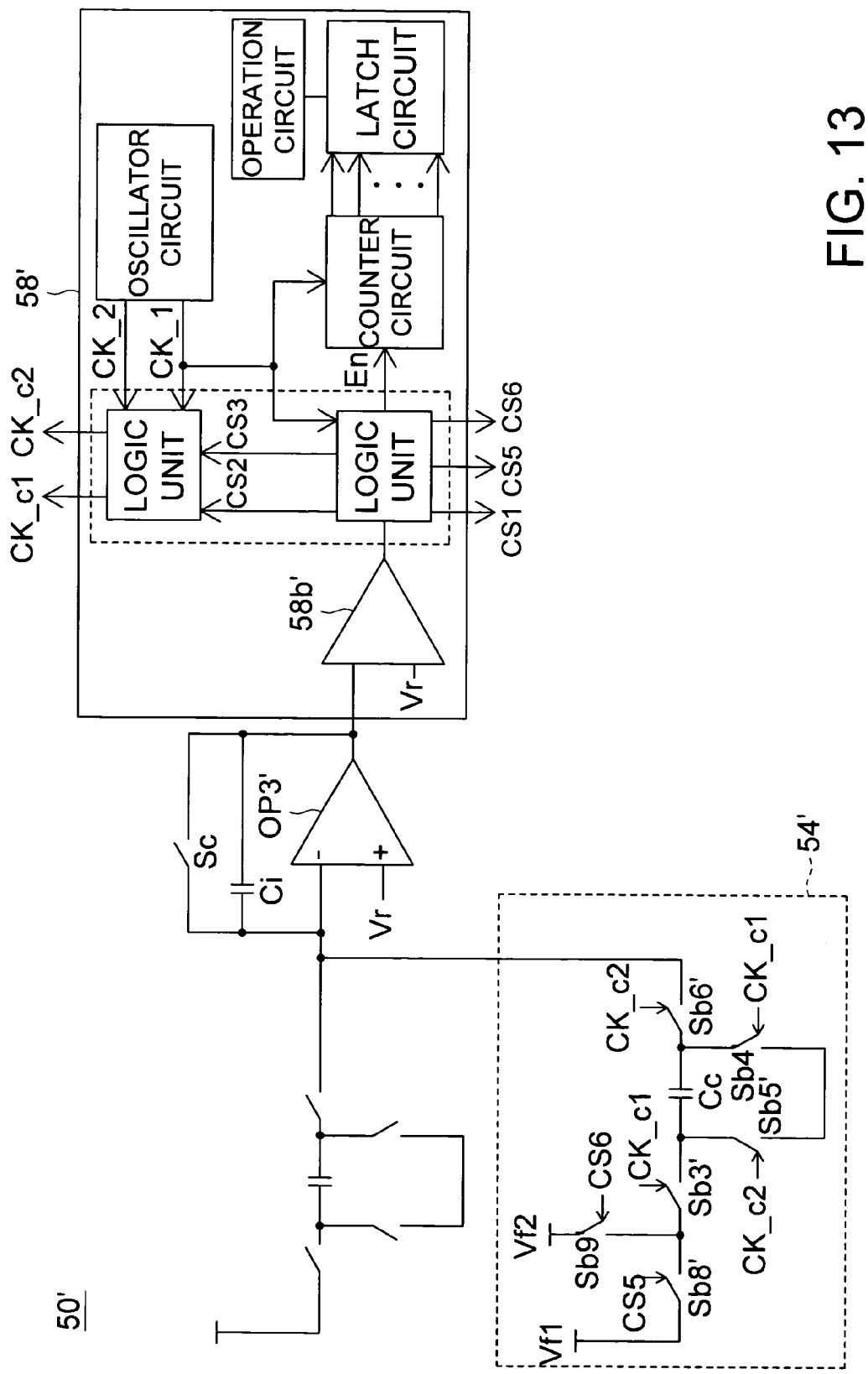
FIG. 13 is another block diagram showing the capacitance measurement circuit according to the fifth embodiment of the invention.

In this illustrated embodiment, switches Sb8 and Sb9 are additionally provided in the control circuit 54 of the measurement circuit 50 to perform the offset voltage correction operation. However, the control circuit 54 of this embodiment is not limited to the structure shown in FIG. 11. In another embodied example, the control circuit 54' is implemented by the known capacitor Cc and the switches Sb3', Sb4', Sb5', Sb6', Sb8' and Sb9', as shown in FIG. 13. The switches Sb3' and Sb4' are controlled by the clock signal CK_c1, and the switches Sb5' and Sb6' are controlled by the clock signal CK_c2. Thus, the capacitance measurement circuit 50' may also perform the offset voltage correction operations on its internal operational amplifier OP3' and comparator circuit 58b'.

In this illustrated embodiment, the end voltage level Vx_Tr of the integrated voltage Vx is higher than the start voltage level of the integrated voltage Vx (equal to the level of the reference voltage Vr). However, the end voltage level Vx_Tr of this embodiment is not limited thereto. In another example, the end voltage level Vx_Tr is lower than the start voltage level. Thus, the voltage differences ΔV3 and ΔV4 are respectively negative and positive real numbers. In addition, the integrated voltage Vx is decreased from the start voltage level to the end voltage level Vx_tr, and increased from the end voltage level Vx_Tr to the start voltage level in the correction sub-periods TP_AJ1 and TP_AJ2, respectively.

According to the above-mentioned descriptions, it is obtained that the capacitance measurement circuit according to this embodiment has the advantages of flexibly measuring different capacitance ranges of the to-be-measured capacitors, of effectively providing another design choice for the capacitance measurement circuit, and of precisely measuring the capacitance of the to-be-measured capacitor.

In addition, the capacitance measurement circuit according to this embodiment further has the advantage of performing the offset voltage correction operations on the internal operational amplifier and comparator circuit.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitance measurement circuit comprising:
an integrator circuit having an input end and an output end, wherein the output end has an integrated voltage, and the integrator circuit, in response to a control signal, sets the integrated voltage to a start voltage level in a voltage setting period;
a first control circuit comprising a first output end and a to-be-measured capacitor, wherein the first output end is electrically coupled to the input end, the first control circuit, in response to a first set of clock signals, switches a voltage on at least one end of the to-be-measured capacitor, and selectively enables one end of the to-be-measured capacitor to be electrically coupled to the first output end so as to control the integrator circuit to perform voltage integration and adjust the integrated voltage from the start voltage level to an end voltage level in a first integration period;
a second control circuit comprising a second output end and a passive device, wherein the passive device has a known characteristic parameter, the second output end is electrically coupled to the input end, the second control circuit, in response to a second set of clock signals, switches a voltage on at least one end of the passive device, and selectively enables one end of the passive device to be electrically coupled to the second output end so as to control the integrator circuit to perform the voltage integration and adjust a level of the integrated voltage from the end voltage level to the start voltage level in a second integration period; and
a processor circuit for providing the first and second sets of clock signals to drive the first and second control circuits, and for measuring a capacitance of the to-be-measured capacitor according to time lengths of the first and second integration periods and the known characteristic parameter.

2. The measurement circuit according to claim 1, wherein the first control circuit further comprises:
a first switch circuit comprising: a first end coupled to a first end of the to-be-measured capacitor, a second end coupled to the input end, and a third end for receiving a first voltage, wherein the first switch circuit, in response to first statuses and second statuses of the first set of clock signals, respectively enables the first end of the to-be-measured capacitor to be coupled to the input end and enables the first end of the to-be-measured capacitor to receive the first voltage.

3. The measurement circuit according to claim 1, wherein the passive device is a known capacitor, and the second control circuit further comprises:
a second switch circuit comprising: a first end coupled to a first end of the known capacitor, a second end coupled to the input end, and a third end for receiving a second voltage, wherein the second switch circuit, in response to first statuses and second statuses of the second set of clock signals, respectively enables the first end of the known capacitor to be coupled to the input end and enables the first end of the known capacitor to receive the second voltage.

4. The measurement circuit according to claim 3, wherein the second control circuit further comprises:
a third switch circuit comprising: a first end coupled to a second end of the known capacitor, a second end for receiving the second voltage, and a third end for receiving a third voltage, wherein the third switch circuit provides the second voltage and the third voltage to the second end of the known capacitor in response to the first statuses and second statuses of the second set of clock signals, respectively;
wherein a level of the second voltage is substantially equal to the start voltage level.

5. The measurement circuit according to claim 2, wherein the first control circuit further comprises:
a fourth switch circuit comprising: a first end coupled to a second end of the to-be-measured capacitor, a second end for receiving the first voltage, and a third end for receiving a fourth voltage, wherein the fourth switch circuit provides the first voltage and the fourth voltage to the second end of the to-be-measured capacitor in response to the first statuses and second statuses of the first set of clock signals, respectively;
wherein a level of the first voltage is substantially equal to the start voltage level.

6. The measurement circuit according to claim 1, wherein the passive device is a known resistor, and the second control circuit further comprises:
a second switch circuit comprising: a first end coupled to a first end of the known resistor, and a second end coupled to the input end, wherein the second switch circuit, in response to first statuses and second statuses of the second set of clock signals, respectively enables the first end of the known resistor to be coupled to the input end and enables the first end of the known resistor to become substantially floating.

7. The measurement circuit according to claim 1, wherein the first and second sets of clock signals have substantially a same clock cycle, lengths of the first and second integration periods substantially and respectively comprise N times the clock cycle and M times the clock cycle, the processor circuit measures the capacitance of the to-be-measured capacitor according to a ratio of N/M, and N and M are natural numbers greater than 1.

8. The measurement circuit according to claim 1, wherein the processor circuit comprises:
an oscillator circuit for generating a third clock signal and a fourth clock signal by way of oscillation, wherein the third and fourth clock signals have substantially inverse phases;
a first logic circuit for generating the control signal in the voltage setting period;
a second logic circuit for generating the first set of clock signals in the first integration period and generating the second set of clock signals at a first time instant after the first integration period;
a comparator circuit for comparing a level of the integrated voltage with a level of the start voltage level, and for triggering an operation event at a second time instant when the level of the integrated voltage satisfies a critical condition;
a counter circuit for performing a counting operation from the first time instant so that a value M indicating number of cycles, starting from zero, is increased by one for every second clock cycle of the second set of clock signals, wherein the counter circuit further stops the counting operation at the second time instant in response to the operation event to obtain the value M, wherein M is a natural number greater than 1; and
a latch circuit for recording the value M in response to the operation event,
wherein the first and second time instants define the second integration period, and the processor circuit obtains the second integration period according to the value M and the clock cycle of the second set of clock signals.

9. The measurement circuit according to claim 1, wherein the integrator circuit comprises:
an operational amplifier having a positive input end for receiving the start voltage level, a negative input end coupled to the input end of the integrator circuit, and an output end coupled to the output end of the integrator circuit;
an integrating capacitor having two ends respectively coupled to the negative input end and the output end of the operational amplifier; and
a fifth switch circuit having a first end and a second end respectively coupled to the negative input end and the output end of the operational amplifier, wherein the fifth switch circuit is turned on in response to the control signal to short-circuit the negative input end and the output end of the operational amplifier so as to set voltages of the negative input end and the output end of the operational amplifier to the start voltage level.

10. The measurement circuit according to claim 1, wherein the integrator circuit comprises:
a fifth switch circuit having a first end for receiving a reference voltage, and a second end coupled to the output end, wherein a level of the reference voltage is substantially equal to the start voltage level; and
an integrating capacitor having a first end coupled to the output end, and a second end for receiving a first voltage.

11. The measurement circuit according to claim 1, wherein the second control circuit further controls the integrator circuit to perform voltage integration in response to a fifth set of clock signals and a sixth set of clock signals in a third integration period and a fourth integration period, respectively, so as to adjust the level of the integrated voltage from the start voltage level to the end voltage level, and adjust the level of the integrated voltage from the end voltage level to the start voltage level, respectively;
wherein the processor circuit performs an offset voltage correction with respect to the measurement circuit according to a time difference between the third and fourth integration periods.

12. The measurement circuit according to claim 11, wherein the passive device is a known capacitor, and the second control circuit further comprises:
a sixth switch circuit comprising: a first end coupled to a first end of the known capacitor, a second end coupled to the input end, and a third end for receiving a first voltage and a fourth end for receiving a second voltage, wherein the sixth switch circuit, in response to first statuses and second statuses of the fifth set of clock signals, respectively enables the first end of the known capacitor to be coupled to the input end and enables the first end of the known capacitor to receive the first voltage, and the sixth switch circuit further, in response to first statuses and second statuses of the sixth set of clock signals, respectively enables the first end of the known capacitor to be coupled to the input end and enables the first end of the known capacitor to receive the second voltage.

13. The measurement circuit according to claim 11, wherein the passive device is a known capacitor, and the second control circuit further comprises:
a seventh switch circuit comprising: a first end coupled to a first end of the known capacitor, a second end coupled to the input end, and a third end for receiving a third voltage, wherein the seventh switch circuit enables the first end of the known capacitor to be coupled to the input end in response to first statuses of the fifth and sixth sets of clock signals, and enables the first end of the known capacitor to receive the third voltage in response to second statuses of the fifth and sixth sets of clock signals; and
an eighth switch circuit comprising: a first end coupled to a second end of the known capacitor, a second end for receiving the third voltage, a third end for receiving a first voltage, and a fourth end for receiving a second voltage, wherein the eighth switch circuit, in response to the first statuses and second statuses of the fifth set of clock signals, respectively enables the second end of the known capacitor to receive the third voltage and to receive the first voltage, and enables the second end of the known capacitor to receive the third voltage and to receive the second voltage in response to the first statuses and second statuses of the sixth set of clock signals, respectively.

14. The measurement circuit according to claim 11, wherein the fifth and sixth sets of clock signals have substantially a same clock cycle, lengths of the third and fourth integration periods substantially and respectively comprise J times the clock cycle and K times the clock cycle, and the processor circuit obtains the time difference according to a difference between J and K and the clock cycle, wherein J and K are natural numbers greater than 1.

15. A capacitance measurement circuit, the circuit comprising:
an integrator circuit having an input end and an output end, wherein the output end has an integrated voltage, and the integrator circuit, in response to a control signal, sets the integrated voltage to a start voltage level in a voltage setting period;
a first control circuit comprising a first output end and a passive device, wherein the passive device has a known characteristic parameter, the first output end is electrically coupled to the input end, the first control circuit switches a voltage on at least one end of the passive device in response to a first set of clock signals, and selectively enables one end of the passive device to be electrically coupled to the first output end so as to control the integrator circuit to perform voltage integration and adjust a level of the integrated voltage from the start voltage level to an end voltage level in a first integration period;
a second control circuit comprising a second output end and a to-be-measured capacitor, wherein the second output end is electrically coupled to the input end, and the second control circuit switches a voltage on at least one end of the to-be-measured capacitor in response to a second set of clock signals, and selectively enables one end of the to-be-measured capacitor to be electrically coupled to the second output end so as to control the integrator circuit to perform the voltage integration and adjust the integrated voltage from the end voltage level to the start voltage level in a second integration period, wherein a capacitance of the to-be-measured capacitor is relevant to a difference between the end and start voltage levels; and
a processor circuit for providing the first and second sets of clock signals to drive the first and second control circuits, and for measuring the capacitance of the to-be-measured capacitor according to time lengths of the first and second integration periods and the known characteristic parameter.

16. A capacitance measurement method applied to a capacitance measurement circuit, the measurement circuit comprising an integrator circuit, one output end of the integrator circuit having an integrated voltage, a to-be-measured capacitor being electrically coupled to an input end of the integrator circuit, the measurement method comprising the steps of:
(a) switching a voltage on at least one end of the to-be-measured capacitor in response to a first set of clock signals so as to adjust a level of the integrated voltage from a start voltage level to an end voltage level in a first integration period;
(b) adjusting the level of the integrated voltage from the end voltage level to the start voltage level in a second integration period in response to a second set of clock signals; and
(c) determining a capacitance of the to-be-measured capacitor according to the first and second integration periods and a known characteristic parameter.

17. The method according to claim 16, further comprising, before the step
(a), the step of:
(d) setting the level of the integrated voltage to the start voltage level in a voltage setting period.

18. The method according to claim 16, further comprising, before the step
(a), the steps of:
(e) switching a voltage on at least one end of a known capacitor in response to a third set of clock signals so as to adjust the level of the integrated voltage from the start voltage level to the end voltage level in a third integration period;
(f) switching the voltage on the at least one end of the known capacitor in response to a fourth set of clock signals so as to adjust the level of the integrated voltage from the end voltage level to the start voltage level in a fourth integration period; and
(g) determining an offset calibrating value according to a difference between the third and fourth integration periods,
wherein the step (c) determines the capacitance of the to-be-measured capacitor according to the first and second integration periods and the offset calibrating value.

19. The method according to claim 18, wherein the first and second integration periods respectively correspond to N clock cycles and M clock cycles, and the step (c) comprises:
measuring the capacitance of the to-be-measured capacitor according to a capacitance of the known capacitor, N and M.

20. The method according to claim 19, wherein the step (c) comprises:
correcting M according to the offset calibrating value; and
determining the capacitance of the to-be-measured capacitor according to the capacitance of the known capacitor, N and the corrected M.

21. A capacitance measurement method applied to a capacitance measurement circuit, the measurement circuit comprising an integrator circuit, one output end of the integrator circuit having an integrated voltage, a to-be-measured capacitor being electrically coupled to an input end of the integrator circuit, the method comprising the steps of:
- (a) adjusting the integrated voltage from a start voltage level to an end voltage level in a first integration period in response to a first set of clock signals;
- (b) switching a voltage on at least one end of the to-be-measured capacitor in response to a second set of clock signals so as to adjust a level of the integrated voltage from the end voltage level to the start voltage level in a second integration period; and
- (c) determining a capacitance of the to-be-measured capacitor according to the first and second integration periods and a known characteristic parameter.

22. The method according to claim 21, further comprising, before the step
- (a), the step of:
- (d) setting the level of the integrated voltage to the start voltage level in a voltage setting period.

23. The method according to claim 21, further comprising, before the step
- (a), the step of:
- (e) switching a voltage on at least one end of a known capacitor in response to a third set of clock signals so as to adjust the level of the integrated voltage from the start voltage level to the end voltage level in a third integration period;
- (f) switching the voltage on the at least one end of the known capacitor in response to a fourth set of clock signals so as to adjust the level of the integrated voltage from the end voltage level to the start voltage level in a fourth integration period; and
- (g) determining an offset calibrating value according to a difference between the third and fourth integration periods.

24. The method according to claim 23, wherein the first and second integration periods respectively correspond to N clock cycles and M clock cycles, and the step (c) comprises:
measuring the capacitance of the to-be-measured capacitor according to a capacitance of the known capacitor, N and M.

25. The method according to claim 21, wherein the step (c) comprises:
correcting M according to the offset calibrating value; and
determining the capacitance of the to-be-measured capacitor according to the capacitance of the known capacitor, N and the corrected M.

* * * * *